US 9,649,997 B2

(12) United States Patent
Fink

(10) Patent No.: US 9,649,997 B2
(45) Date of Patent: May 16, 2017

(54) APPARATUS FOR LOCATION-DEPENDENT CONFIGURATION

(71) Applicant: CONTINENTAL AUTOMOTIVE GMBH, Hannover (DE)

(72) Inventor: Michael Fink, Regenstauf (DE)

(73) Assignee: Continental Automotive GmbH, Hannover (DE)

(*) Notice: Subject to any disclaimer, the term of this patent is extended or adjusted under 35 U.S.C. 154(b) by 498 days.

(21) Appl. No.: 14/350,141

(22) PCT Filed: Oct. 4, 2012

(86) PCT No.: PCT/EP2012/069668
§ 371 (c)(1),
(2) Date: Apr. 7, 2014

(87) PCT Pub. No.: WO2013/050503
PCT Pub. Date: Apr. 11, 2013

(65) Prior Publication Data
US 2014/0246902 A1    Sep. 4, 2014

(30) Foreign Application Priority Data

Oct. 7, 2011   (DE) .................. 10 2011 084 147

(51) Int. Cl.
B60R 16/02    (2006.01)
G01R 19/155   (2006.01)
G01R 19/165   (2006.01)
H01R 27/02    (2006.01)
(Continued)

(52) U.S. Cl.
CPC .......... *B60R 16/02* (2013.01); *B60L 11/1818* (2013.01); *B60R 16/00* (2013.01);
(Continued)

(58) Field of Classification Search
CPC ..... B60L 11/1818; B60R 16/00; B60R 16/02; G01R 19/155; G01R 19/165;
(Continued)

(56) References Cited

U.S. PATENT DOCUMENTS 5,729,115 A    3/1998  Wakefield
5,911,050 A *  6/1999  Egan ................... G06F 13/4068
                                                361/58
(Continued)

FOREIGN PATENT DOCUMENTS

DE    10121786 A1    11/2002
DE    102004018827 B4  6/2006
(Continued)

*Primary Examiner* — Levi Gannon
(74) *Attorney, Agent, or Firm* — Laurence A. Greenberg; Werner H. Stemer; Ralph E. Locher

(57) ABSTRACT

An apparatus for the location-dependent configuration of a device is coupled to the apparatus. The apparatus has first and second power supply terminals, a locating terminal for locating the apparatus on the basis of a voltage applied to the locating terminal, and a configuration device for configuring the device on the basis of the voltage that is applied to the locating terminal. The first power supply terminal and the locating terminal are formed by the same terminal.

8 Claims, 5 Drawing Sheets

(51) Int. Cl.
*H02J 7/00* (2006.01)
*B60L 11/18* (2006.01)
*B60R 16/00* (2006.01)
*H01R 29/00* (2006.01)

(52) U.S. Cl.
CPC ......... *G01R 19/155* (2013.01); *G01R 19/165* (2013.01); *G01R 19/16538* (2013.01); *H02J 7/0034* (2013.01); *H02J 7/0036* (2013.01); *H01R 27/02* (2013.01); *H01R 29/00* (2013.01)

(58) Field of Classification Search
CPC ........ G01R 19/16533; G01R 19/16538; H01R 27/02; H01R 29/00; H02J 7/0034; H02J 7/0036
USPC .................. 307/9.1, 10.1; 340/657, 660–663; 714/56
See application file for complete search history.

(56) References Cited

U.S. PATENT DOCUMENTS

| | | | |
|---|---|---|---|
| 6,130,519 A * | 10/2000 | Whiting | H02J 7/0034 320/105 |
| 6,457,071 B1 * | 9/2002 | Thorland | G06F 13/4081 710/100 |
| 6,693,521 B2 | 2/2004 | Lorenz et al. | |
| 7,222,046 B2 | 5/2007 | Fischer et al. | |
| 7,675,433 B2 | 3/2010 | Hellwig | |
| 8,191,474 B2 | 6/2012 | Foley et al. | |
| 8,392,764 B2 | 3/2013 | De Buen | |
| 2005/0162020 A1 | 7/2005 | Lanni | |
| 2006/0038693 A1 | 2/2006 | Miyake et al. | |
| 2008/0164841 A1 * | 7/2008 | Nam | H02J 7/0045 320/110 |
| 2011/0231044 A1 | 9/2011 | Fassnacht | |
| 2012/0268448 A1 * | 10/2012 | Wicky | G09G 3/006 345/212 |

FOREIGN PATENT DOCUMENTS

| | | |
|---|---|---|
| DE | 102006012237 B3 | 4/2007 |
| DE | 102006025174 A1 | 12/2007 |
| DE | 102008042677 A1 | 4/2010 |
| DE | 102010043991 A1 | 6/2011 |
| EP | 1457847 A2 | 9/2004 |
| WO | 9748162 A2 | 12/1997 |

* cited by examiner

APPARATUS FOR LOCATION-DEPENDENT CONFIGURATION

BACKGROUND OF THE INVENTION

Field of the Invention

The present invention relates to an apparatus in for location-dependent configuration of a device coupled to the apparatus, in particular a control device of a vehicle, to a socket-outlet arrangement having two identically shaped, asymmetrical socket outlets for such an apparatus and to a vehicle having such a socket-outlet arrangement. The apparatus comprises a first and a second power supply connection, a locating connection for locating the apparatus on the basis of a voltage present at the locating connection, and a configuration device for configuring the device on the basis of the voltage that is present at the locating connection.

By way of example, a generic apparatus is helpful for automatic configuration of a control device in the vehicle on the basis of the installation position of said control device. In the case of, for example, two possible installation positions in the vehicle, the control device is intended to independently detect its own position once it has been installed in the vehicle and configure itself in accordance with this position. One solution which is known from the prior art is to configure such a control device before the installation process and then to position said control device at the correct position in the vehicle. It goes without saying that this solution is very elaborate and therefore costly.

Furthermore, DE102004018827B4 discloses an apparatus for determining the wheel position of wheels of a wheeled vehicle. Different wheel units on the vehicle have an additional connection which is provided solely for location and to which a DC voltage potential which is characteristic of the wheel unit is applied in order to be used as identifying characteristic. Owing to said DC voltage potential, the wheel unit on the wheel is assigned an individual identifier.

DE102006025174A1 discloses an apparatus for determining the sensor position of sensor units. Each sensor unit comprises more connections than necessary for connecting the sensor unit to a data bus. In this case, the specific connection scheme of the data bus with the connections provides an identifier for the sensor position of a sensor unit.

DE102006012237B3 discloses another apparatus for determining the sensor position of sensor units. A data bus connects the sensor units in series, with the result that a data output of one sensor unit is connected to the data input of the following sensor unit. An individual identifier is assigned to the sensor units on the basis of the sequence thereof.

BRIEF SUMMARY OF THE INVENTION

Proceeding from this prior art, an object of the present invention is to provide a simple apparatus for location-dependent configuration of a device coupled to the apparatus.

This object is achieved according to the invention by means of an apparatus as claimed. Embodiments are specified in the dependent claims.

The present invention comprises an apparatus for location-dependent configuration of a device coupled to the apparatus. A device such as this can be, in particular, a control device of a vehicle, which control device has a different response depending on the location at which the control device is installed. The apparatus is equipped with a first and second power supply connection and a locating connection for locating or localizing the apparatus on the basis of a voltage present at the locating connection. In addition, the apparatus comprises a configuration device for configuring the device on the basis of the voltage present at the locating connection. According to the invention, the first power supply connection and the locating connection are the same connection.

In this way, only two connections are required, with the result that minimal demands are placed on the interface. Since the configuration device configures the device on the basis of the voltage present at the locating connection, the device does not need to be configured before the installation thereof, with the result that savings can be made during the manufacturing process. By providing a configurable device, two similar devices do not need to be produced and distributed; rather, only a single device which automatically configures itself appropriately in the vehicle. As a result of this, significant savings can be made in terms of logistics.

The apparatus according to the invention preferably comprises a bridge rectifier circuit having two inputs and two outputs. The first of the two inputs is coupled to the first power supply connection and the second of the two inputs is coupled to the second power supply connection. A negative voltage is present at a first of the two outputs when a negative voltage is present at one of the two inputs. Equally, a positive voltage is present at a second of the two outputs when a positive voltage is present at one of the two inputs. In one embodiment, the bridge rectifier circuit has a plurality of diodes.

Owing to the bridge rectifier circuit, the device can be supplied with voltage always in the same polarity direction, irrespective of which of the two power supply connections has a negative and a positive voltage. In this way, the polarity direction of the power supply connections can be used to locate the apparatus.

In one embodiment, the apparatus according to the invention comprises an asymmetrical plug comprising the first and second power supply connections. Owing to the asymmetrical design of the plug, said plug can be inserted into a socket outlet complementary thereto only in a single specific position. Alternatively, the apparatus according to the invention could also be arranged in a housing which is shaped such that, when the apparatus according to the invention is installed in a vehicle, it is ensured that the apparatus is supplied with power in a predefined polarity direction.

In addition, the present invention comprises a socket-outlet arrangement having two identically shaped, asymmetrical socket outlets, wherein the socket outlets are designed to accommodate an apparatus for location-dependent configuration according to the invention. A first of the two socket outlets is configured such that the first power supply connection of the apparatus is coupled to a positive voltage when the apparatus is arranged in the first socket outlet. The second of the two socket outlets is correspondingly configured such that the first power supply connection of the apparatus is coupled to a negative voltage when the apparatus is arranged in the second socket outlet. According to the invention, it is possible for a socket outlet not only to be asymmetrical because the housing thereof is asymmetrical; rather, any asymmetry is conceivable that makes it possible for the apparatus according to the invention to be inserted into the socket outlet in only one single predefined polarity direction.

In addition, the present invention comprises a vehicle having a socket-outlet arrangement according to the invention, wherein the first socket outlet is arranged at a first installation position in the vehicle and the second socket outlet is arranged at a second installation position in the vehicle.

The polarity direction of the apparatus according to the invention therefore differs depending on the installation position in the vehicle at which the apparatus is used, with the result that, owing to the polarity direction, the device can be located and, on the basis of the location, the device can be configured correspondingly. In this case, the device can be, in particular, a control device for the vehicle, which control device is intended to have a different response depending on the installation position in the vehicle at which the control device is used. According to the invention, a control device such as this can thus correspondingly adapt its response in a simple manner, on the basis of the polarity direction in which the apparatus according to the invention is supplied with power.

Of course, it is also possible for a vehicle to have only one single asymmetrical socket outlet. The device, which is correspondingly configured by means of the apparatus for location-dependent configuration, has a different response depending on whether the first power supply connection of the apparatus is coupled to a positive or a negative voltage when the apparatus is plugged into the socket outlet.

By virtue of this principle, significant savings can be made in terms of logistics since identically constructed devices can be used for different functionalities or variants in a vehicle.

Further details and configurations of the present invention are explained in the following text with reference to the figures, in which:

BRIEF DESCRIPTION OF THE SEVERAL VIEWS OF THE DRAWING

In the following description, the same reference signs are used for identical and functionally identical elements.

DESCRIPTION OF THE INVENTION

Figure 1:
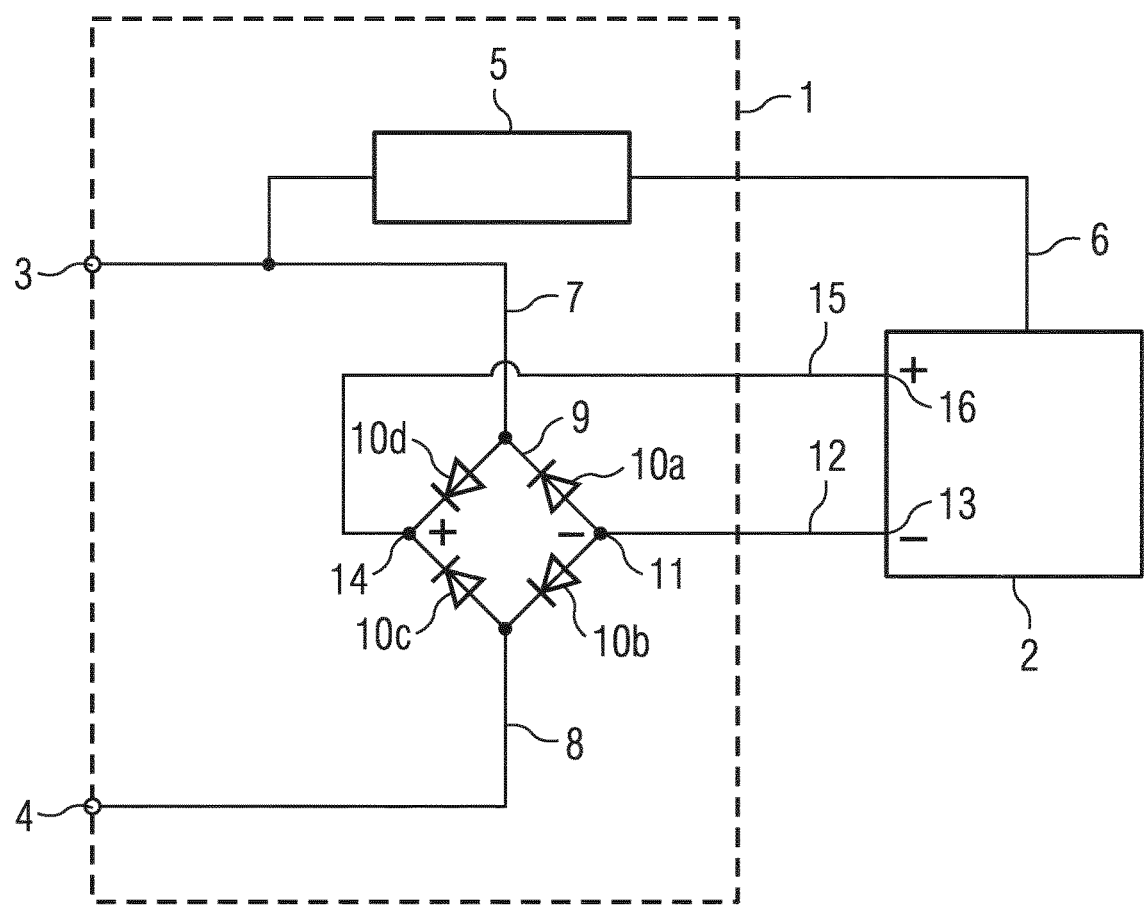
FIG. 1 shows a first embodiment of an apparatus according to the invention.

FIG. 1 illustrates a first embodiment of an apparatus 1 according to the invention for location-dependent configuration of a device 2 coupled to the apparatus. The apparatus 1 is indicated here by a dashed line. It comprises a first and a second power supply connection 3, 4. The first power supply connection 3 is simultaneously a locating connection for locating the apparatus 1 on the basis of a voltage present at the locating connection 3. A configuration device 5 configures the device 2 via the data bus 6 in accordance with the voltage present at the locating connection 3. The voltage present at the power supply connections 3 and 4 is simultaneously used to supply the device 2 with electrical energy.

For this purpose, the first and second power supply connections 3, 4 are connected to a bridge rectifier circuit 9 via two lines 7, 8.

The bridge rectifier circuit 9 has four diodes 10a, 10b, 10c, 10d. In this case, the diodes 10a and 10b are arranged such that a negative voltage is present at a first 11 of the two outputs of the bridge rectifier circuit, irrespective of which of the two power supply connections has a negative voltage coupled thereto. The first output 11 of the bridge rectifier circuit is connected via a line 12 to the connection 13 for supplying the device 2 with a negative voltage.

The diodes 10c and 10d are in turn arranged such that a positive voltage is present at a second 14 of the two outputs of the bridge rectifier circuit, irrespective of which of the two power supply connections 3, 4 is provided with a positive voltage. The second output 14 of the bridge rectifier circuit is connected via a line 15 to a connection 16 for supplying the device 2 with a positive voltage. Thus, the device 2 is supplied with electrical energy via the connections 13 and 16 and configured via the data bus 6 according to the polarity direction at the two power supply connections 3, 4.

Figure 2:
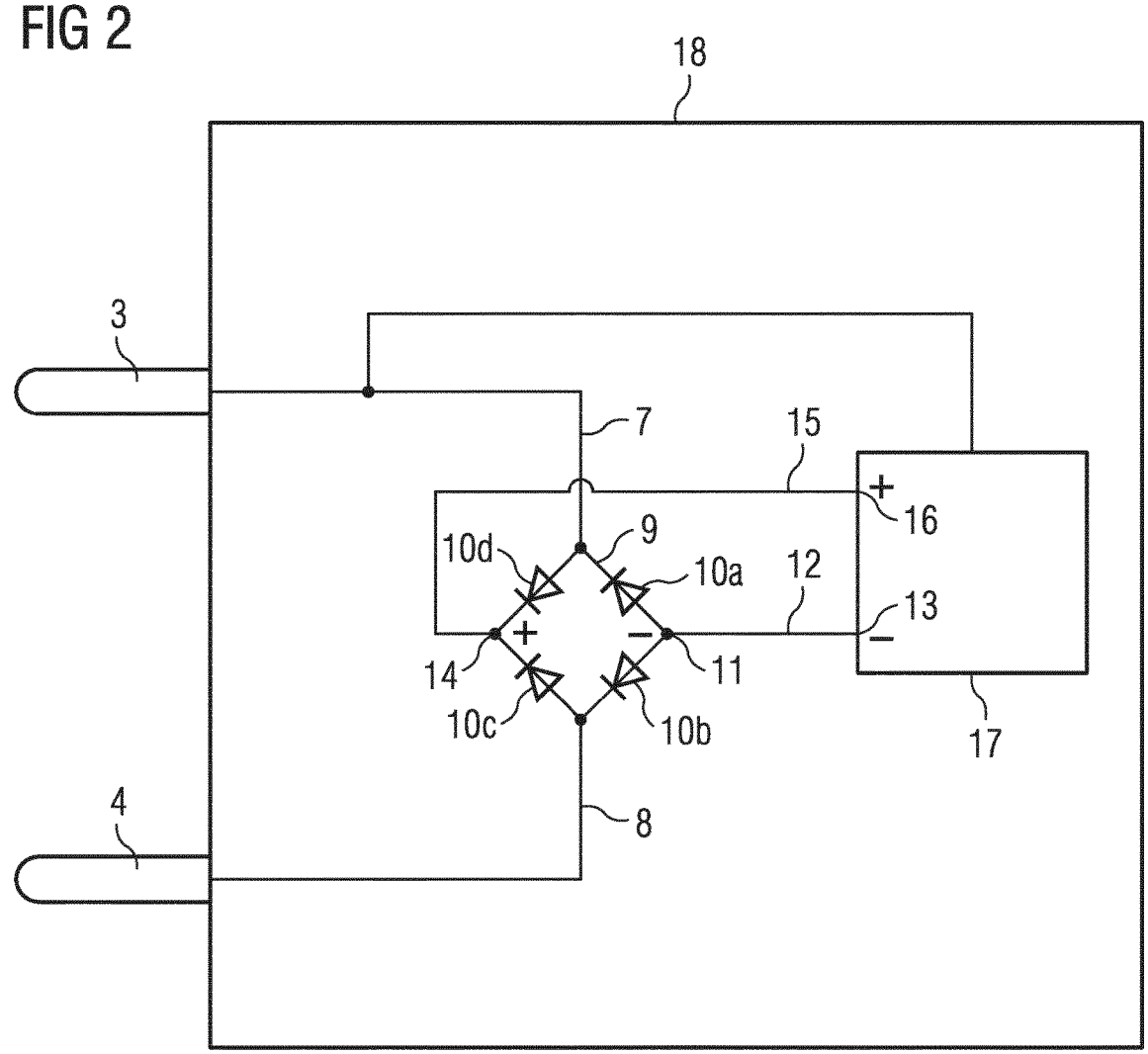
FIG. 2 shows a second embodiment of an apparatus according to the invention.

As illustrated by the second embodiment of an apparatus according to the invention illustrated in FIG. 2, the configuration device and the device to be configured can be realized using a common microprocessor 17. Said microprocessor 17 therefore comprises the configuration device 5 and the device 2 to be configured from FIG. 1. By way of example, said microprocessor can be located inside a housing 18, on which an asymmetrical plug is arranged directly. This is suggested in FIG. 2 by virtue of the fact that the two power supply connections 3 and 4 are illustrated as contact pins.

Figure 3:
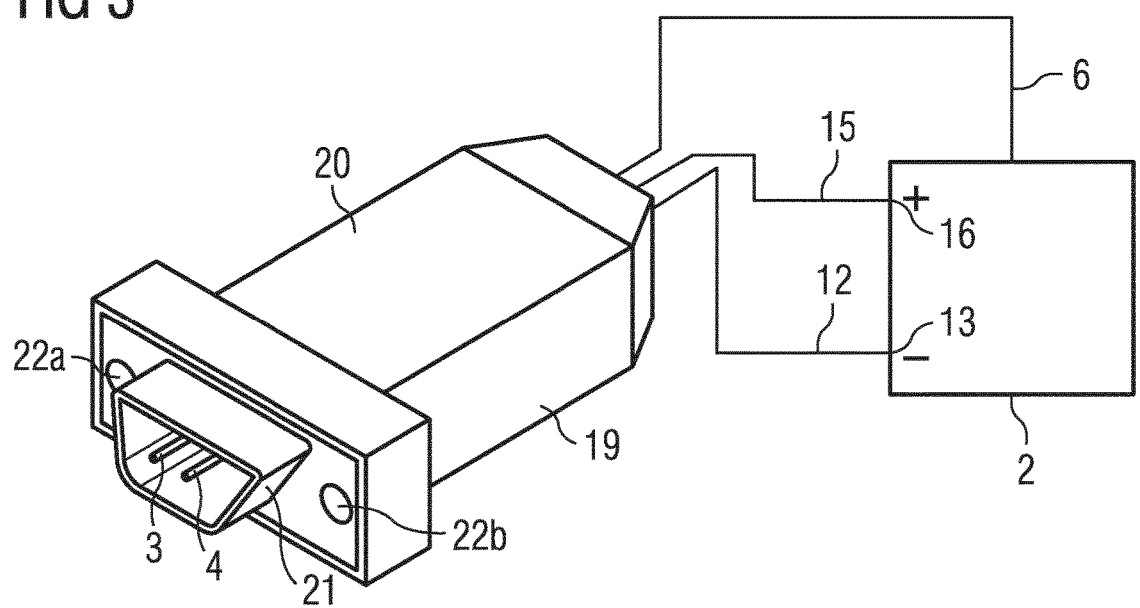
FIG. 3 shows a third embodiment of an apparatus according to the invention.

FIG. 3 shows a third embodiment of an apparatus according to the invention for location-dependent configuration of a device 2 coupled to the apparatus 19. The illustrated apparatus 19 comprises a housing 20 and an asymmetrical plug 21 which houses the first and second power supply connections 3, 4 in the form of contact pins. Here, the asymmetrical plug 21 is configured such that it can be plugged into a complementary socket outlet only in one direction. Holes 22a and 22b are provided to the sides of the asymmetrical plug 21, which holes can be used in order to fasten the apparatus 19 by means of screws—not illustrated—to a complementary socket outlet. The interior of the housing 20, which houses, in particular, the elements which are illustrated inside the apparatus 1 in FIG. 1, is likewise not illustrated. Therefore, the housing 20 comprises, inter alia, the configuration device 5 and the bridge rectifier circuit 9. The device 2 is in turn connected to the apparatus via the lines 12, 15 and the data bus 6.

Figure 4:
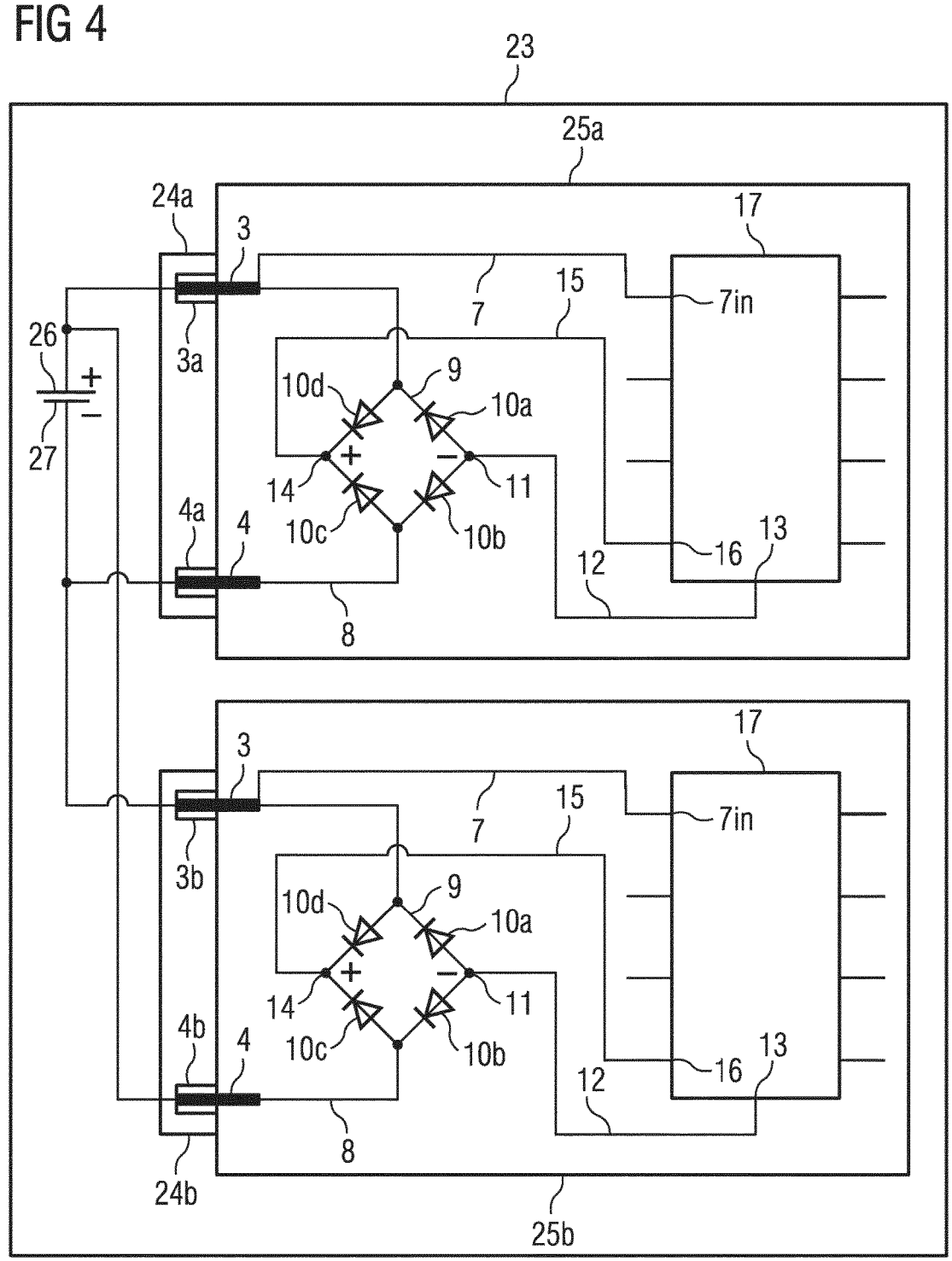
FIG. 4 shows a schematic illustration of an embodiment of a socket-outlet arrangement according to the invention having two embodiments of an apparatus according to the invention.

FIG. 4 illustrates a schematic illustration of an embodiment of a socket-outlet arrangement 23 according to the invention. The shown socket-outlet arrangement 23 comprises a first socket outlet 24a having a first socket 3a and a second socket 4a, and a second socket outlet 24b having a first socket 3b and a second socket 4b. An embodiment of an apparatus 25a according to the invention is located in the first socket outlet 24a. Said first apparatus 25a substantially corresponds to the embodiment shown in FIG. 2. The connection of the microcontroller 17, at which connection the voltage used for location is present, is additionally denoted by 7in. As is made clear by FIG. 4, the first power supply connection 3, which is in the form of a contact pin, of the first apparatus 25a is inserted into the first socket 3a of the first socket outlet 24a. The second power supply connection 4, which is in the form of a contact pin, of the first apparatus 25a is located in the second socket 4a of the first socket outlet 24a. The first socket 3a is connected to a positive voltage 26 and the second socket 4a is connected to a negative voltage 27.

In accordance with an embodiment, a second apparatus 25b according to the invention is located in the second socket outlet 24b. The first power supply connection 3 of the second apparatus 25b is located in the first socket 3b of the second socket outlet 24b and the second power supply connection 4 of the second apparatus 25b is located in the second socket 4b of the second socket outlet 24b. The first socket 3b is connected to the negative voltage 27 and the second socket 4b is connected to the positive voltage 26. Therefore, the first socket outlet 24a has a different polarity direction than the second socket outlet 24b. In this way, the microcontrollers 17 in the first apparatus 25a and the second apparatus 25b can have a different response. In this case, the microcontrollers 17 can be, in particular, a control device of a vehicle, which control device has a different response depending on the installation position in the vehicle.

Figure 5:
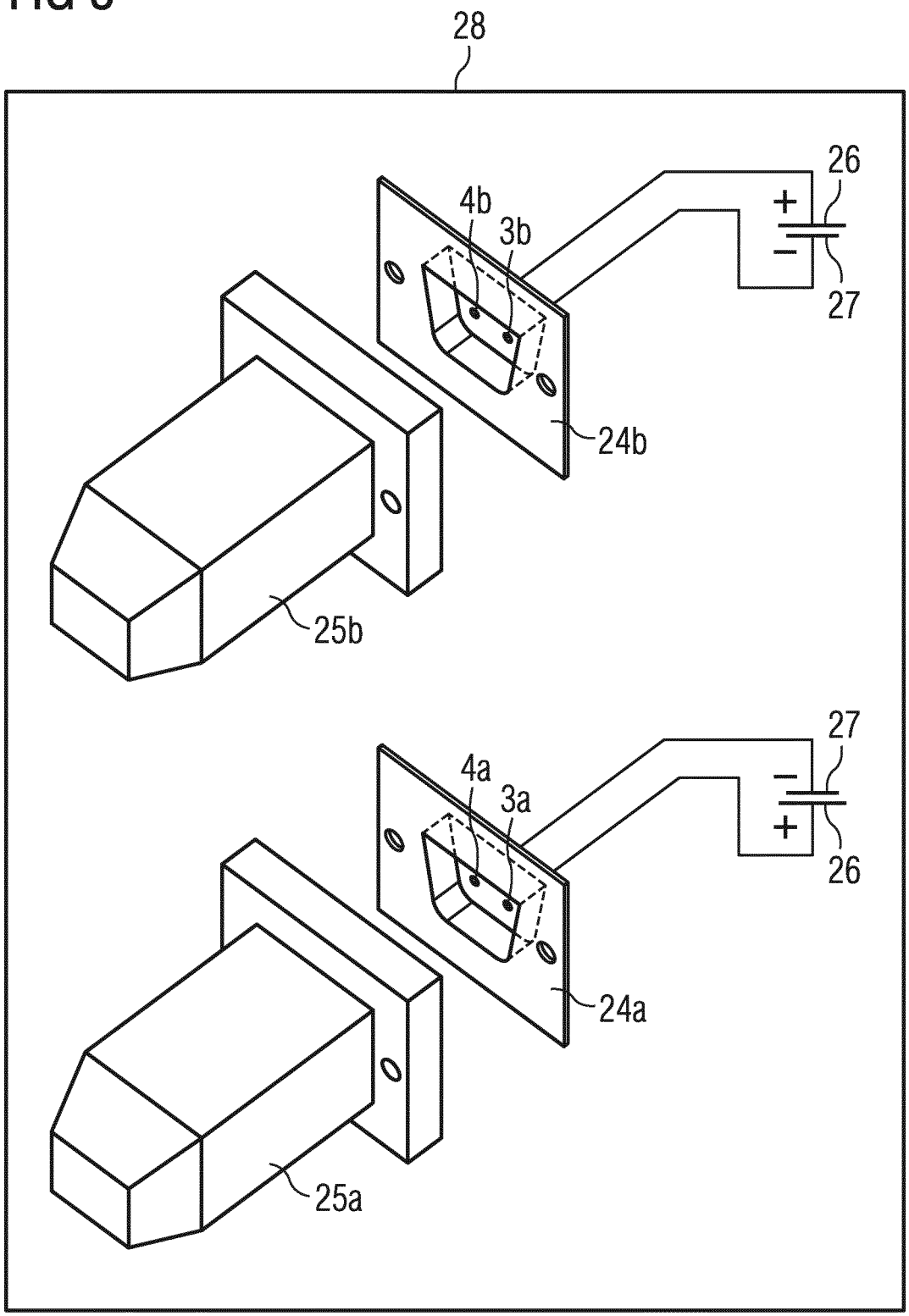
FIG. 5 shows a schematic illustration of an embodiment of a vehicle according to the invention having an embodiment of a socket-outlet arrangement according to the invention.

FIG. 5 schematically illustrates an embodiment of a vehicle 28 according to the invention having two identically shaped, asymmetrical socket outlets 24a, 24b which are arranged at two different installation positions in the vehicle 28. The shown embodiments of an apparatus 25a, 25b according to the invention can be inserted into said socket outlets 24a, 24b by means of a plug—not shown. The first socket outlet 24a has a first power supply socket 3a, in which the first power supply connection 3 of a corresponding plug can be accommodated. Here, the first socket 3a of the first socket outlet 24a is connected via a line to a positive voltage 26. In addition, the first socket outlet 24a has a second socket 4a in order to accommodate the second power supply connection 4 in the form of a contact pin. Said second socket 4a is connected via a further line to a negative voltage 27.

The second socket outlet 24b also has two sockets 3b, 4b, into which the contact pins 3, 4 of a plug can be inserted. In this case, the second socket 4b is connected via a line to the positive voltage 26. Correspondingly, a negative voltage 27 is present at the first socket 3b via a line.

Thus, the first power supply connection 3 of the apparatus 25a is coupled to a positive voltage 26 when the apparatus 25a is arranged in the first socket outlet 24a. In contrast, the second socket outlet 24b is configured such that the first power supply connection 3 of the apparatus 25b is coupled to a negative voltage 27 when the apparatus 25b is plugged into the second socket outlet 24b.

In this way, it is possible to identify the installation position at which the apparatuses 25a, 25b are located in the vehicle 28, with the result that the devices coupled to the apparatuses 25a, 25b can be configured correspondingly.

The invention can afford significant advantages. Savings can be made in the manufacturing process since a factory configuration step is not required. The interface requirements are minimal since only those electrical contacts are used which are required anyway for the power supply. Owing to the use of identically constructed devices, which are automatically configured correspondingly, savings in terms of logistics can be made. The explanations given in respect of the figures should be understood as being purely illustrative and not restrictive. Many amendments can be made to the embodiments without departing from the scope of protection of the invention as set forth in the attached claims. By way of example, it is possible to combine the features of various embodiments with one another in order thus to provide further embodiments.

LIST OF REFERENCE SIGNS 1 first embodiment of an apparatus according to the invention
2 device
3 first power supply connection
3a first socket of the first socket outlet
3b first socket of the second socket outlet
4 second power supply connection
4a second socket of the first socket outlet
4b second socket of the second socket outlet
5 configuration device
6 data bus
7 line
7in connection for the voltage used for location
8 line
9 bridge rectifier circuit
10a-10d diode
11 first output of the bridge rectifier circuit
12 line
13 connection for negative voltage
14 second output of the bridge rectifier circuit
15 line
16 connection for positive voltage
17 microcontroller
18 housing
19 third embodiment of an apparatus according to the invention
20 housing
21 asymmetrical plug
22a, 22b fastening holes
23 embodiment of a socket-outlet arrangement according to the invention
24a first socket outlet
24b second socket outlet
25a, 25b embodiment of an apparatus according to the invention
26 positive voltage
27 negative voltage
28 schematic illustration of an embodiment of a vehicle according to the invention

The invention claimed is:

1. An apparatus for location-dependent configuration of a device coupled to the apparatus, the apparatus comprising:
a first connection forming a first power supply connection and a locating connection for locating the apparatus on a basis of a voltage present at said locating connection;
a second connection forming a second power supply connection;
a configuration unit connected to said first connection and adapted for configuring the device on a basis of a voltage present at said locating connection; and
a bridge rectifier circuit having a first input coupled to said first power supply connection and a second input coupled to said second power supply connection, a first output and a second output;
wherein a negative voltage is present at said first output when a negative voltage is present at one of said first and second inputs, and a positive voltage is present at said second output when a positive voltage is present at one of said first and second inputs.

2. The apparatus according to claim 1, wherein the device is a control device of a vehicle.

3. The apparatus according to claim 1, wherein said bridge rectifier circuit comprises a plurality of diodes.

4. The apparatus according to claim 1, which comprises an asymmetrical plug comprising said first and second power supply connections.

5. A socket-outlet arrangement, comprising:
   two identically shaped, asymmetrical socket outlets for an apparatus according to claim 1;
   a first of said two socket outlets being configured such that said first power supply connection of the apparatus is coupled to a positive voltage when the apparatus is arranged in said first socket outlet, and a second of said two socket outlets being configured such that said first power supply connection of the apparatus is coupled to a negative voltage when the apparatus is arranged in said second socket outlet.

6. A vehicle, comprising:
   a socket-outlet arrangement according to claim 5 having said first socket outlet disposed at a first installation position in the vehicle and said second socket outlet disposed at a second installation position in the vehicle.

7. In an apparatus for location-dependent configuration of a device coupled to the apparatus, wherein the apparatus comprises:
   a first power supply connection and a second power supply connection;
   a locating connection for locating the apparatus based on a voltage present at said locating connection; and
   a configuration device connected to said locating connection and adapted for configuring the device on a basis of the voltage present at said locating connection;
   the improvement which comprises:
   said first power supply connection and said locating connection are one and the same connection; and
   a bridge rectifier circuit having first and second inputs and first and second outputs, wherein said first input is coupled to said first power supply connection and said second input is coupled to said second power supply connection, and wherein a negative voltage is present at said first output when a negative voltage is present at one of said two inputs, and a positive voltage is present at said second output when a positive voltage is present at one of said two input.

8. The apparatus according to claim 7, wherein the device is a control device of a vehicle.

* * * * *